United States Patent [19]

Lou

[11] 4,082,966
[45] Apr. 4, 1978

[54] MOS DETECTOR OR SENSING CIRCUIT

[75] Inventor: Perry W. Lou, Houston, Tex.

[73] Assignee: Texas Instruments Incorporated, Dallas, Tex.

[21] Appl. No.: 754,473

[22] Filed: Dec. 27, 1976

[51] Int. Cl.² ............. H03K 5/18; H03K 17/60; G11C 13/08; G11C 17/04
[52] U.S. Cl. ............. 307/362; 307/238; 307/251; 307/DIG. 1; 307/DIG. 3; 307/DIG. 4; 365/103; 365/203
[58] Field of Search ............. 307/238, 251, 362, 363, 307/352, 353, DIG. 1, DIG. 3, DIG. 4, DIG. 5; 340/173 SP, 173 R (U.S. only), 173 DR (U.S. only)

[56] References Cited

U.S. PATENT DOCUMENTS

| 3,662,188 | 5/1972 | Williams | 307/DIG. 1 X |
| 3,808,458 | 4/1974 | Mundy et al. | 307/251 X |
| 3,983,414 | 9/1976 | Stafford et al. | 307/251 |

OTHER PUBLICATIONS

Cassidy et al., "Low-Input Impedance FET (ORBI-FET) Sense Amplifier," *IBM Tech. Discl. Bull.;* vol. 17, No. 1, pp. 23-24; 6/1974.

*Primary Examiner*—Larry N. Anagnos
*Attorney, Agent, or Firm*—James T. Comfort; John G. Graham

[57] ABSTRACT

A detector circuit for MOS/LSI integrated circuit devices comprises a series transistor which has a sense clock applied to its gate and a gated capacitor connected between the gate and a sense node. The sense node and an input node may be precharged to a level at or near the supply. During the sense clock, the input and sense nodes are shunted together by the series transistor. If at the logic level of the supply, the gated capacitor is off and does not affect the circuit; if the input node decays toward the other logic level, the gated capacitor is on and the trailing edge of the sense clock causes the sense node to be switched to a full logic level.

12 Claims, 4 Drawing Figures

U.S. Patent     April 4, 1978     4,082,966
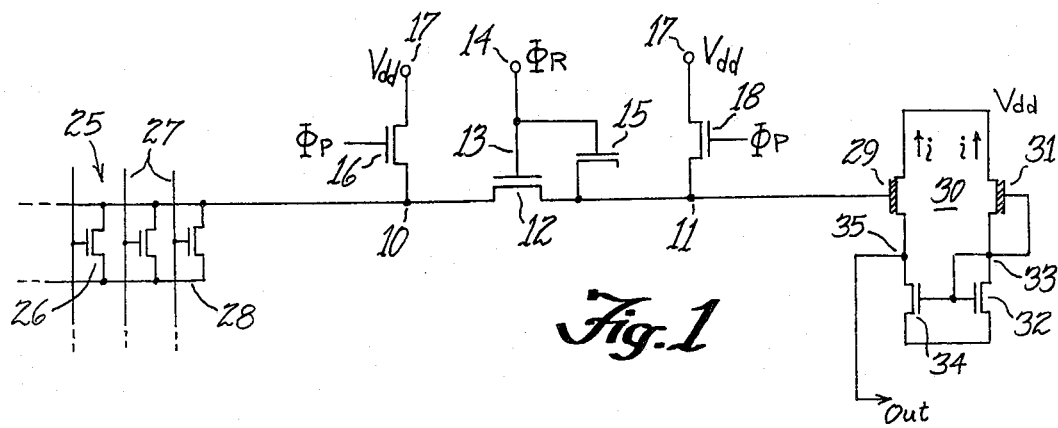
Fig. 1
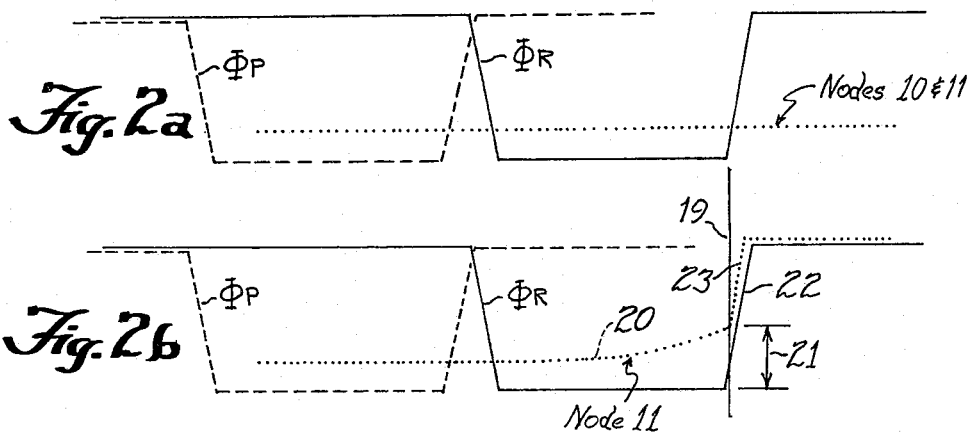
Fig. 2a
Fig. 2b
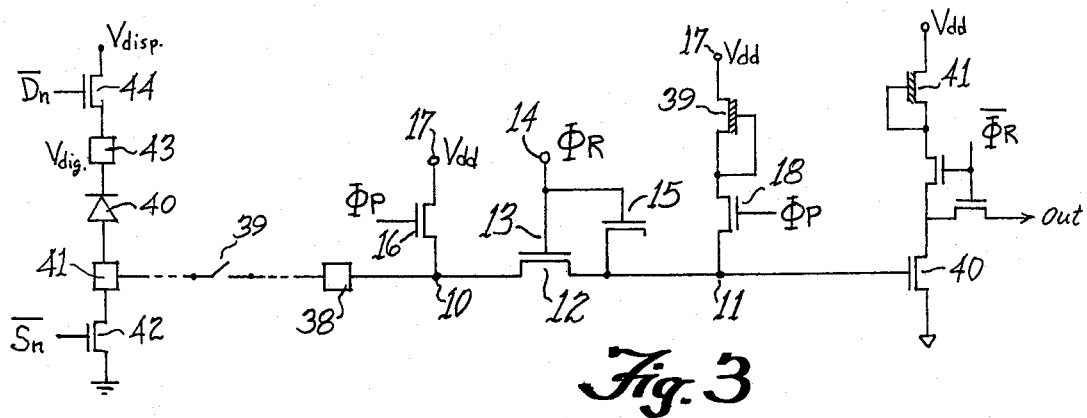
Fig. 3

MOS DETECTOR OR SENSING CIRCUIT

BACKGROUND OF THE INVENTION

This invention relates to sensing circuits using MOS transistors and more particularly to a circuit for detecting low-level signals as may be present at the output of a read-only-memory or a keyboard input to a microcomputer chip.

In an MOS/LSI chip of the type shown in U.S. Pat. No. 3,988,604, issued Oct. 26, 1976 to J. H. Raymond and assigned to Texas Instruments, a read-only-memory or ROM is disclosed which is of the virtual ground type. A similar ROM is disclosed in U.S. Pat. No. 3,900,722, issued Aug. 17, 1975 to Michael J. Cochran and Charles P. Grant, Jr., also assigned to Texas Instruments. In these devices, the ROM output lines are precharged during one part of an operating cycle, then conditionally discharged during a read cycle when the ROM output is detected. The ROM output lines are elongated diffused regions in the semiconductor chip and can exhibit large capacitance. As the number of bits on an output line is increased, the capacitance increases because the line becomes longer. This causes the decay time to be longer, so the precharged output lines may not decay to a definite "ground" logic level during the alloted time in the read cycle. This problem is more troublesome as the size of the ROM is increased from say 8K to 16K to 32K, etc., as the number of bits on a line may go from 64 to 128 to 256. A similar problem of detecting a voltage change which is less than a logic level occurs in many situations in MOS/LSI circuit devices. For example, a keyboard input to a calculator chip may be less than a full logic level of 0 to 9v.

It is therefore the principal object of this invention to provide a sensing or detecting circuit which will respond to a low level signal in a short time period. Another object is to provide an improved detector circuit for a ROM output or a keyboard input (or similar circuit) in an MOS/LSI device. A further object is to provide a simple and small circuit layout for a sense or detector circuit.

SUMMARY OF THE INVENTION

In accordance with an embodiment of the invention, a sense or detector circuit is provided by an MOS transistor which has its source-to-drain path connected in series between an input node and a sense node. A gate capacitor is connected between the gate of the MOS transistor and the sense node. The nodes may be precharged to a voltage at or near the supply, i.e., a full logic level, prior to a sense cycle. The gate of the MOS transistor is driven by a sense clock which turns on the transistor during the sense cycle. If the input node is to stay at the logic level near the supply, then the two nodes both end up charged to this voltage and the channel of the gated capacitor is not depleted so its capacitance is low. However, if the input node starts to decay toward the logic level of reference potential or ground, then the sense node follows, and the gated capacitor is biased on. Thus, the trailing edge of the read clock couples a charge to the sense node which forces it to the ground logic level even though the input node had decayed to only a fraction of this level.

THE DRAWINGS

The novel features believed characteristic of the invention are set forth in the appended claims. The invention itself, however, as well as other features and advantages thereof, may best be understood by reference to the following detailed description of illustrative embodiments, when read in conjunction with the accompanying drawings, wherein:

FIG. 1 is a schematic diagram of an electrical circuit for detecting a ROM output using the features of the invention;

FIGS. 2a–2b are graphic representations of voltage waveforms appearing in the circuit of FIG. 1, plotted as a function of time; and FIG. 3 is a schematic diagram of an electrical circuit for detecting a keyboard input of a calculator chip using the features of the invention.

DETAILED DESCRIPTION OF A SPECIFIC EMBODIMENT

Referring now to FIG. 1, a detector circuit according to the invention is illustrated. The circuit includes an input node 10 and a sense node 11 which are connected together by the source-drain path of a series MOS transistor 12. A gate electrode 13 of the transistor 12 is connected to a source 14 of read or sense clock pulses $\Phi R$ as shown in FIG. 2a. A gated capacitor 15 is connected between the source 14 of read clock $\Phi R$ and the node 11. For P-channel MOS devices, the polarity of the gated capacitor 15 is such that the gate 13 must be more negative than the sense node 11 by greater than a threshold voltage $Vt$ to invert the channel region under the top electrode or gate of the capacitor and thus make it exhibit a large value of capacitance. When this voltage is less than $Vt$, the magnitude of the capacitance of the gated capacitor 15 is very small. In a typical application of the circuit of FIG. 1, the input node 10 is precharged by a transistor 16 connected between the node and a $Vdd$ supply 17. Likewise, the sense node 11 is precharged by a transistor 18 connecting the node to the $Vdd$ supply. A precharge clock $\Phi P$ as seen in FIG. 2a turns on these transistors 16 and 18 during a time interval preceding the read clock $\Phi R$. The voltage level of the clock $\Phi P$ may be zero to $-Vdd$, in which case the nodes 10 and 11 precharge to $-(Vdd-Vt)$, or the clock $\Phi P$ may be at a level higher than $-Vdd$ so that the nodes 10 and 11 are precharged to a full $Vdd$ level.

In operation of the circuit thus far described, the input node 10 tends to either stay at a "0" level, at or near $-Vdd$, or it tends to decay toward ground or $Vss$ which is ordinarily the "1" level in P-channel positive logic. First, if it is assumed that the node 10 stays at "0" level, then when the transistor 12 is turned on by the $\Phi R$ clock no current flows through it, and the nodes 10 and 11 stay the same through the time inverval while the $\Phi R$ clock is at $-Vdd$. The voltage across the gated capacitor 15 will not be at barely $Vt$; the node 14 is at $Vdd$ and the node 11 at $-(Vdd-Vt)$. When the trailing edge of $\Phi R$ occurs at a time 19 as seen in FIG. 2a, no significant charge is coupled to the node 11 because a small charge is lost from the capacitor 15 due to charge sharing when the capacitance to substrate of the node 11 is taken into account and so the capacitor 15 does not have sufficient voltage to deplete it. Thus, both nodes 10 and 11 stay at the "0" level. In constrast, if the input node 10 tends to discharge toward $Vss$ or the "1" level during the read clock $\Phi R$ as seen by the dotted line 20 of FIG. 2b, the node 11 will follow it. Then, at time 19 the voltage 21 across the gated capacitor will be greater than $Vt$ so the capacitance will be large. Thus, the relatively steep $dv/dt$ of the trailing edge 22 of the $\Phi R$ pulse will result in coupling of charge from ΦR to the node 11, driving this node toward Vss as seen by a line 23. Actually, the line 23 tends to go positive to an amount equal to the forward threshold of the source or drain to substrate P-N junction of the MOS transistor. Thus, the node 11 reaches a very good "1" level immediately after the ΦR clock, whereas the node 10 may take many times that long to decay to Vss.

The capacitance to substrate of the node 11 must be much smaller than the capacitance of the gated capacitor 15 when it is in the inverted or turned on state, because the voltage change on the node 11 caused by the trailing edge 22 will be proportional to the ratio of the value of the gated capacitor to the value of the sum of the two. To get a large voltage change represented by the line 22, the gated capacitor is a large area device. Also, the input capacitance of the circuit connected to the node 11 must be small.

In one preferred use of the circuit of the invention, the node 10 is an output line of a virtual ground ROM 25 of the type shown in the afore-mentioned U.S. Pat. Nos. 3,988,604 and 3,900,722. Only a small number of MOS cells 26 are shown, but the ROM would typically contain many thousands. The output line which provides the node 10 may have 128 or 256 cells on it, i.e., the node is an elongated diffused P-type region which forms the sources or drains of all of the cells in a column. Thus, the node has a large capacitance to the substrate, and it cannot change voltage quickly when it must be discharged through one of the cells 26. The metal lines 27 of the ROM provide the gates for the cells, and one of these lines 27 goes to a "0" logic level during the ΦR clock. All of the sources in the column shown are connected to a line 28 which is grounded through a decoder in accord with the design of virtual ground ROM's.

The output of the circuit of FIG. 1 is connected to a depletion mode transistor 29 which is part of a current mirror source follower circuit 30 of the type set forth in my copending patent application Ser. No. 754,377 filed herewith and assigned to Texas Instruments. The depletion mode transistor 29 is exactly the same size and shape as a matching depletion mode transistor 31 which has gate shorted to source so it acts as a constant current device. In series with the transistor 31 is an enhancement mode transistor 32 which has its gate shorted to its drain; it is in saturation with a known drain current set by the constant current device. The voltage on the node 33 will be fairly constant with changes in supply voltage. The gate of the transistor 32 or the node 33 is connected to the gate of an enhancement mode transistor 34, and the output of the circuit is taken at a node 35 between the series connected transistors 29 and 34. The two enhancement transistors 32 and 34 are of exactly the same size and shape. Also, the two depletion mode transistors 29 and 31 are of exactly the same size and shape (or same ratios).

A given current flows through the transistor 31, and of necessity the same current flows through the transistor 32 because they are in series. Since the transistors 32 and 34 are the same size and shape, and because the gate-to-source voltages are the same for each (their gates are tied together and their sources are both grounded), and if transistor 34 is in saturation, these transistors must conduct the same current, so the given current $i$ also flows in the series path of the transistors 29 and 34. The transistors 29 and 31 are identical, and they conduct the same current $i$, and their drains are both at Vdd. The gate of the transistor 31 is tied to its source at node 33 so its source voltage will always equal its gate voltage; the source voltage of the transistor 29 must therefore always equal its gate voltage. Therefore, the circuit 30 functions as a source follower which has zero voltage drop between its input (node 11) and its output (node 35). Also, it has no "Miller" capacitance because there is no gain. This permits the circuit of FIG. 1 to detect very small voltage level changes.

In FIG. 3, another embodiment of the invention is shown, this being used to detect a keyboard input in a calculator, for example. A keyswitch line from a keyboard array is connected to an input pad 38. A closure of key 39 will provide a signal in the −3 to −5 volt area. The key 39 is in a matrix of keyswitches, for example 8 × 5 or 40 keys, and the matrix is shunted by the display diodes such as a diode 40 in a complex network, not shown. A display diode or LED 40 has a drop of 1.5 to 1.9 V. Segment scan terminals 41 on the calculator chip are connected to ground in segments through segment buffers 42, and digit terminals 43 on the chip are contacted to a voltage Vdisp., less than Vdd, by digit buffers 44. The voltage on the digit terminal 43 referred to as Vdig, is about −(Vdisp.−Vt) or about −(7 − Vt), so, taking into account the drop across the LED 40, the voltage on the key input terminal 38 is about −3 to −5 volts when $\overline{Sn}$ and $\overline{Dn}$ are at −Vdd and the key is closed. However, due to the complex paths through the switch matrix and display diodes, the voltage on the terminal 38 could be within about two volts of this value when a different segment is being scanned. Thus, the detector of the invention must distinguish this type of input. The pad 38 is directly connected to the input node 10 of a circuit according to the invention. A series transistor 12 connects the node 10 to an output node 11 as above, and the gate 13 of the transistor 12 is connected to a ΦR source 14. In this case, rather than (Vss to −Vdd) ΦR switches between Vss and −(Vdig. + Vt) to simulate the voltage for a valid closure. The threshold for the node 11 to "detect" is generally (VΦR − Vt), due to the Vt requirement of the gated capacitor 15 to invert; in this case the threshold is −(Vdig. − Vt) −Vt or about Vdig. The pad 38 is precharged by a transistor 16 whose gate is booted to a high voltage to charge the node 10 to a full −Vdd level. The node 11 is precharged by a transistor 18, through a depletion mode transistor 39 so the node 11 will be at (Vdd−Vt). Output from the circuit is taken from an invertor stage having a small driver transistor 40, a depletion load 41, and a clocked output gated on $\overline{\Phi R}$. The transistor 40 is small so its capacitance loading on the node 11 is small. For example, the gate area of the transistor 40 is less than one-tenth the gate area of the capacitor 15.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed is:

1. A circuit for detecting a voltage on an input node and providing a high level voltage change on a sense node, comprising: a transistor having a source-drain path connected in series between the input node and the sense node and having a gate; a gated capacitor separate from the inherent capacitance of the transistor connected between the gate of the transistor and the sense node, the gated capacitor switching from a very low capacitance mode to a high capacitance mode when the voltage across it exceeds a threshold value; means to apply a read clock pulse of a given voltage level to the gate of the transistor; the output on said sense node after said read clock pulse being two-valued, one value occurring when the voltage on the input node is no more than said threshold value different from said given voltage level and the other occurring when the voltage on the input node is more than said threshold value different from the given voltage level.

2. A circuit according to claim 1 wherein means are provided for precharging the input node to a voltage level not more than said threshold value different from said given voltage, prior to said read clock pulse.

3. A circuit according to claim 1 wherein the transistor is a P-channel MOS transistor and the gated capacitor has its gate electrode connected to the gate of the MOS transistor.

4. A circuit according to claim 3 wherein means are provided to precharge the input and sense nodes to said voltage prior to the read clock pulse.

5. A circuit for detecting a voltage on an input node and providing a high level voltage change on a sense node, comprising: a transistor having a source-drain path connected in series between the input node and the sense node and having a gate; a gated capacitor connected between the gate of the transistor and the sense node, the gated capacitor switching from a very low capacitance mode to a high capacitance mode when the voltage across it exceeds a threshold value; means to apply a read clock pulse of a given voltage level to the gate of the transistor; means to apply a two-valued signal to the input node one value being no more than said threshold value different from said given voltage level and the other being more than said threshold value different from the given voltage level, means for precharging the input node to a voltage level not more than said threshold value different from said given voltage, prior to said read clock pulse, and means for precharging the sense node to a voltage level the same as the input node, prior to the read clock pulse.

6. A circuit according to claim 5 wherein the sense node exhibits a capacitance which is very small compared to capacitance exhibited by the gated capacitor in said high capacitance mode.

7. A sense circuit for a semiconductor memory of the type having an array of memory cells in rows and columns, comprising: an MOS transistor being a source-to-drain path and a gate; an input node connected to a column line of the array; a sense node connected to output circuitry; means connecting the source-to-drain path of the MOS transistor in series between the input node and the sense node; means applying a read pulse to the gate of the MOS transistor, the read pulse having a given voltage level and having leading and trailing edges; a capacitor separate from the inherent capacitance of the MOS transistor connected between the gate of the MOS transistor and the sense node, the capacitor exhibiting a low capacitance value when the voltage across it is below a threshold and exhibiting a high value when the voltage across it is more than said threshold; the trailing edge of the read pulse being coupled to the sense node by the capacitor when the voltage on the sense node differs from said given voltage level by at least said threshold, but not being significantly coupled to the sense node when the voltage on the sense node differs from said given voltage by less than said threshold.

8. A circuit according to claim 7 including means for precharging the input node and the sense node prior to said leading edge to a voltage level which differs from said given voltage level by less than said threshold.

9. A circuit according to claim 7 wherein the capacitance of the sense node is much less than the capacitance of said capacitor.

10. An input circuit for an MOS/LSI semiconductor chip for detecting small voltage changes, comprising: an MOS transistor having a source-to-drain path and a gate; an input node connected to an input terminal of the semiconductor chip; a sense node connected to output circuitry; means connecting the source-to-drain path of the MOS transistor in series between the input node and the sense node; means applying a read pulse to the gate of the MOS transistor, the read pulse having a given voltage level and having leading and trailing edges; a capacitor separate from the inherent capacitance of the MOS transistor connected between the gate of the MOS transistor and the sense node, the capacitor exhibiting a low capacitance value when the voltage across it is below a threshold and exhibiting a high value when the voltage across it is more than said threshold; the trailing edge of the read pulse being coupled to the sense node by the capacitor when the voltage on the sense node differs from said given voltage level by at least said threshold, but not being significantly coupled to the sense node when the voltage on the sense node differs from said given voltage by less than said threshold.

11. A circuit according to claim 10 including means for precharging the input node and the sense node prior to said leading edge to a voltage level which differs from said given voltage level by less than said threshold.

12. A circuit according to claim 10 wherein the capacitance of the sense node is much less than the capacitance of said capacitor.

* * * * *